United States Patent
Kwak et al.

(10) Patent No.: US 9,837,015 B2
(45) Date of Patent: Dec. 5, 2017

(54) DISPLAY DEVICE AND METHOD OF DRIVING THE SAME

(71) Applicant: SAMSUNG DISPLAY CO., LTD., Yongin, Gyeonggi-Do (KR)

(72) Inventors: Boo-Dong Kwak, Yongin-si (KR); Jun-Heyung Jung, Yongin-si (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 163 days.

(21) Appl. No.: 14/637,577

(22) Filed: Mar. 4, 2015

(65) Prior Publication Data

US 2016/0086531 A1    Mar. 24, 2016

(30) Foreign Application Priority Data

Sep. 24, 2014  (KR) ........................ 10-2014-0127599

(51) Int. Cl.
- *G06T 1/60* (2006.01)
- *G09G 5/39* (2006.01)
- *G09G 3/3208* (2016.01)
- *G11C 16/34* (2006.01)

(52) U.S. Cl.
CPC ..... *G09G 3/3208* (2013.01); *G09G 2320/043* (2013.01); *G09G 2360/16* (2013.01); *G11C 16/3436* (2013.01)

(58) Field of Classification Search
CPC . G06T 1/60; G09G 5/393; G09G 5/39; G09G 3/3208
USPC ................ 345/530, 537, 543, 544, 564, 565
See application file for complete search history.

(56) References Cited

U.S. PATENT DOCUMENTS

| | | | |
|---|---|---|---|
| 2002/0073358 A1* | 6/2002 | Atkinson | G06F 9/4418 714/21 |
| 2008/0072107 A1 | 3/2008 | Jung et al. | |
| 2008/0250172 A1* | 10/2008 | Tanaka | G06F 3/0605 710/63 |
| 2009/0190397 A1 | 7/2009 | Cho et al. | |
| 2009/0254689 A1* | 10/2009 | Karamcheti | G06F 12/0246 710/301 |
| 2010/0020111 A1 | 1/2010 | Yu et al. | |
| 2010/0180068 A1* | 7/2010 | Matsumoto | G06F 11/1441 711/103 |
| 2011/0063283 A1* | 3/2011 | Ryu | G09G 3/3283 345/214 |
| 2013/0222049 A1* | 8/2013 | Lee | H03K 17/22 327/534 |
| 2013/0286028 A1* | 10/2013 | Hur | G09G 5/39 345/540 |

(Continued)

FOREIGN PATENT DOCUMENTS

| | | |
|---|---|---|
| KR | 10-2008-0024893 A | 3/2008 |
| KR | 10-2009-0083759 A | 8/2009 |

(Continued)

*Primary Examiner* — Zhengxi Liu
*Assistant Examiner* — Yi Yang
(74) *Attorney, Agent, or Firm* — Lee & Morse, P.C.

(57) ABSTRACT

A display device includes a non-volatile memory device including a plurality of memory sets and a controller to store deterioration data of the pixels in each of the memory sets, to compensate input image data based on the deterioration data to generate output image data, and to provide output signals corresponding to the output image data to the scan driver and the data driver.

3 Claims, 9 Drawing Sheets

(56) References Cited

U.S. PATENT DOCUMENTS

2014/0157083 A1* 6/2014 Shalvi .................. G06F 11/14
714/763

FOREIGN PATENT DOCUMENTS

| KR | 10-2010-0011641 A | 2/2010 |
| KR | 10-2011-0028752 A | 3/2011 |

* cited by examiner

DISPLAY DEVICE AND METHOD OF DRIVING THE SAME

CROSS-REFERENCE TO RELATED APPLICATION

Korean Patent Application No. 10-2014-0127599, filed on Sep. 24, 2014, and entitled, "Display Device and Method of Driving the Same," is incorporated by reference herein in its entirety.

BACKGROUND

1. Field

One or more embodiments described herein relate to a display device and a method of driving a display device.

2. Description of the Related Art

An organic light emitting diode (OLED) includes an organic layer between an anode and a cathode. Positive holes from the anode are combined with electrons from the cathode in the organic layer to induce light emission. A display made from OLED pixels has a variety of advantages such as a wide viewing angle, a rapid response speed, relatively thin thickness, and low power consumption.

Over time, the performance of an OLED pixel may deteriorate. As result, luminance from the pixel may decrease. The pixels in an organic light emitting display device may degrade with differing degrees of deterioration.

Various methods have been proposed to compensate for this deterioration, in order to prevent a decrease in luminance and display quality. However, a high-resolution display device may use a high-capacity memory device to store deterioration data of pixels. This may increase manufacturing costs and result in deterioration data loss by an abnormal termination.

SUMMARY

In accordance with one embodiment, a display device includes a display panel including a plurality of pixels; a scan driver to provide scan signals to the pixels; a data driver to provide data signals to the pixels; a non-volatile memory device including a plurality of memory sets; and a controller to store deterioration data of the pixels in each of the memory sets, to compensate input image data based on the deterioration data to generate output image data, and to provide output signals corresponding to the output image data to the scan driver and the data driver.

Each of the memory sets may include a block data area in which block data are stored, the block data being generated by dividing the deterioration data by a block unit; and a block count area in which block counts are stored, the block counts each indicating a position in which each of the block data is stored. First validation data for verifying integrity of the block data may be stored in the block data area, and second validation data for verifying integrity of the block counts may be stored in the block count area. First validation data and the second validation data may be generated by a parity checking technique, a checksum checking technique, or a cyclic redundancy check (CRC) technique.

The controller may verify the integrity of the block data using the first validation data, and verify the integrity of the block counts using the second validation data after the controller stores the block counts and the block data in the each of the memory sets.

The controller may include a volatile memory device in which the deterioration data of the pixels are to be stored while the display panel operates; and a deterioration data controller to: read the deterioration data from the non-volatile memory device and to load the deterioration data on the volatile memory device when the display panel is initialized, and to update the deterioration data stored in the volatile memory device using the input image data. The deterioration data controller may periodically read the deterioration data from the volatile memory device and may periodically store the deterioration data in the non-volatile memory device.

The controller may include a deterioration compensator to compensate the input image data based on the deterioration data stored in the volatile memory device to generate the output image data. The deterioration data may be cumulatively stored in the non-volatile memory.

In accordance with another embodiment, a display device includes a display panel including a plurality of pixels; a non-volatile memory device including first through (N)th memory groups, each of the first through (N)th memory groups including a plurality of memory sets, where N is an integer greater than 1; and first through (N)th integration drivers to store deterioration data of the pixels in each of the memory sets included in one of the first through (N)th memory groups, to compensate input image data based on the deterioration data to generate output image data, and to provide output signals corresponding to the output image data to the pixels.

At least one of the first through (N)th integration drivers may include a status register for checking whether the non-volatile memory device operates, and the first through (N)th integration drivers may store the deterioration data in the non-volatile memory device at different times by monitoring the status register.

Each of the memory sets may include a block data area in which block data are stored, the block data being generated by dividing the deterioration data by a block unit; and a block count area in which block counts are stored, the block counts each indicating a position in which each of the block data is stored. First validation data for verifying integrity of the block data may be stored in the block data area, and second validation data for verifying integrity of the block counts may be stored in the block count area.

A (K)th memory group of the first through (N)th memory groups may include a master memory set and a slave memory set, where K is an integer between 1 and N, and a (K)th integration driver of the first through (N)th integration drivers may sequentially store the deterioration data in each of the master memory set and the slave memory set included in the (K)th memory group.

Each of the first through (N)th integration drivers may include a volatile memory device in which the deterioration data of the pixels are stored while the display panel operates; and a deterioration data controller to read the deterioration data from the non-volatile memory device and to load the deterioration data on the volatile memory device when the display panel is initialized, and to update the deterioration data stored in the volatile memory device using the input image data. The deterioration data controller may periodically reads the deterioration data from the volatile memory device and may periodically store the deterioration data in the non-volatile memory device.

In accordance with another embodiment, a method of driving a display device, that includes first through (N)th integration drivers each periodically storing deterioration data of pixels in a non-volatile memory device that includes first through (N)th memory groups and each compensating image data based on the deterioration data, where N is an integer greater than 1, the method comprising: checking whether the non-volatile memory device operates by monitoring a status register; setting the status register to indicate an operating mode when the non-volatile memory device does not operate; reading and increasing, at a (K)th integration driver, a master block count from a master memory set included in a (K)th memory group and a slave block count from at least one of slave memory sets in the (K)th memory group, the master block count and the slave block count, each indicating a position in which each of block data is stored, the block data generated by dividing the deterioration data by a block unit, where K is an integer between 1 and N; storing, at the (K)th integration driver, the increased master block count and the block data in the master memory set included in the (K)th memory group; storing, at the (K)th integration driver, the increased slave block count and the block data in the slave memory set included in the (K)th memory group; and setting the status register to indicate a stand-by mode.

Reading and increasing the master block count and the slave block count may include reading the master block count from a master block count area in the master memory set of the (K)th memory group; verifying integrity of the master block count; reading the slave block count from a slave block count area in the slave memory set of the (K)th memory group; verifying integrity of the slave block count; and increasing the master block count and the slave block count.

Storing the increased master block count and the block data in the master memory set may include storing the increased master block count in a master block count area included in the master memory set of the (K)th memory group; verifying integrity of the master block count stored in the master block count area; storing the block data in a master block data area in the master memory set of the (K)th memory group; and verifying integrity of the block data stored in the master block data area. Storing the increased slave block count and the block data in the slave memory set may include storing the increased slave block count in a slave block count area in the slave memory set of the (K)th memory group; verifying integrity of the slave block count stored in the slave block count area; storing the block data in a slave block data area in the slave memory set of the (K)th memory group; and verifying integrity of the block data stored in the slave block data area.

BRIEF DESCRIPTION OF THE DRAWINGS

Features will become apparent to those of skill in the art by describing in detail exemplary embodiments with reference to the attached drawings in which.

DETAILED DESCRIPTION

Example embodiments are described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. In the drawings, the dimensions of layers and regions may be exaggerated for clarity of illustration. Like reference numerals refer to like elements throughout.

Figure 1:
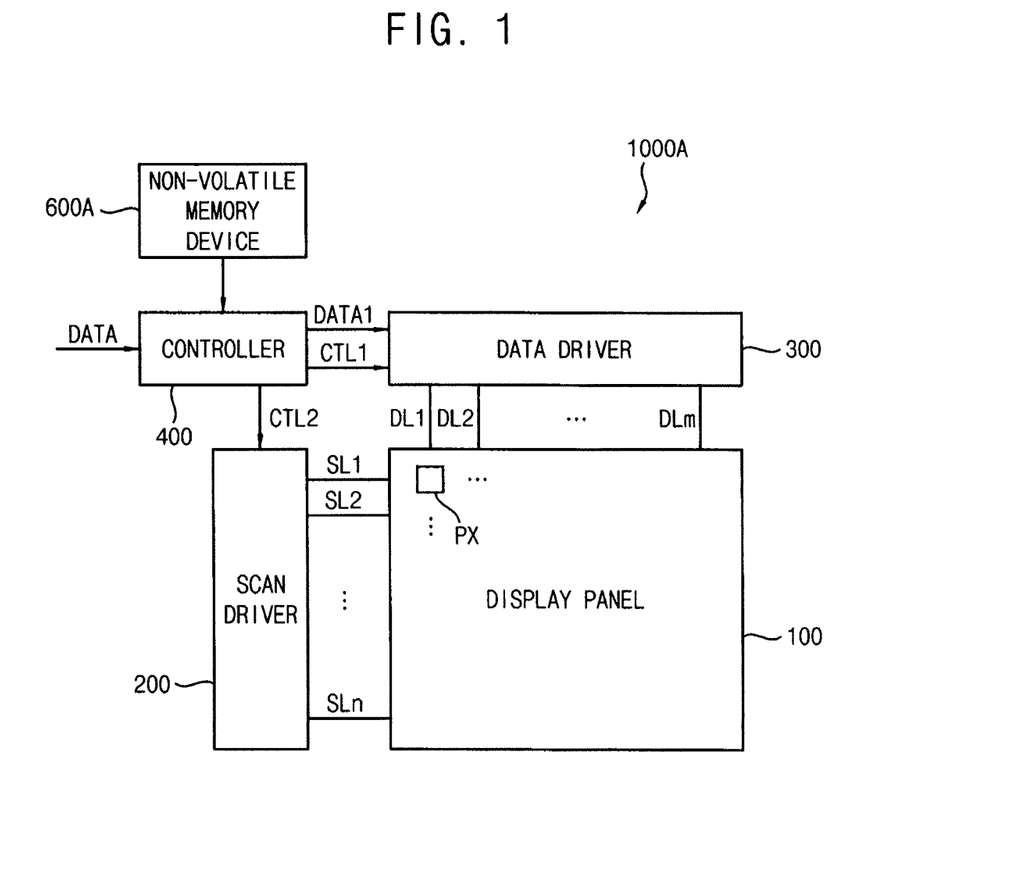
FIG. 1 illustrates an embodiment of a display device.

FIG. 1 illustrates an embodiment of a display device 1000A which includes a display panel 100, a scan driver 200, a data driver 300, a controller 400 and a non-volatile memory device 600A.

The display panel 100 may include a plurality of pixels PX. The display panel 100 may be connected to the scan driver 200 via scan lines SL1 through SLn. The display panel 100 may be connected to the data driver 300 via data lines DL1 through DLn. The display panel 100 may include n*m pixels PX arranged at locations corresponding to crossing points of the scan lines SL1 through SLn and the data lines DL1 through DLn.

The scan driver 200 provides scan signals to the pixels PX via the scan lines SL1 through SLn.

The data driver 300 provides data signals to the pixels PX via the data lines DL1 through DLn.

The controller 400 stores deterioration data of the pixels PX in the non-volatile memory device 600A. The deterioration data may include variety of data for compensating deterioration of the pixels PX. For example, the deterioration data may include cumulative driving data of the pixels PX and/or cumulative driving time of the pixels PX.

The controller 400 may redundantly store deterioration data of the pixels PX in each of the memory sets of the non-volatile memory device 600A, in order to prevent deterioration data loss by abnormal termination. In one embodiment, the controller 400 may verify integrity of the deterioration data using validation data after storing the deterioration data in each of the memory sets. For example, the controller 400 may store validation data (e.g., parity value) for verifying integrity of the deterioration data along with the deterioration data in the non-volatile memory device 600A.

The controller 400 may compensate input image data DATA based on the deterioration data to generate output image data DATA1. Thus, the controller 400 may compensate input image data DATA using the deterioration data to reduce luminance difference between the pixels PX.

In addition, the controller 400 may include a timing control part that provides control signals CTL1, CTL2 corresponding to the output image data DATA1 to the scan driver 200 and the data driver 300, thereby controlling the scan driver 200 and the data driver 300.

The non-volatile memory device 600A may include a plurality of memory sets to redundantly store the deterioration data. The non-volatile memory device 600A may be located outside of the controller 400. The non-volatile memory device 600A may have a variety of advantages such as capability to maintain stored data while power is not supplied, capability to store mass data, low cost, etc. For example, the non-volatile memory device 600A may include flash memory, erasable programmable read-only memory (EPROM), electrically erasable programmable read-only memory (EEPROM), phase change random access memory (PRAM), resistance random access memory (RRAM), nano floating gate memory (NFGM), polymer random access memory (PoRAM), magnetic random access memory (MRAM), or ferroelectric random access memory (FRAM).

In one embodiment, the deterioration data may be accumulatively stored in the non-volatile memory device 600A as time passes. The cumulatively stored deterioration data may be used for restoring damaged deterioration data and/or to improve the quality of the display panel 100.

The display device 1000A may further include a power supply providing high power voltage and low power voltage to the display panel 100, an emission driver providing emission signals to the pixels PX, and/or other drivers or control circuits.

Figure 2:
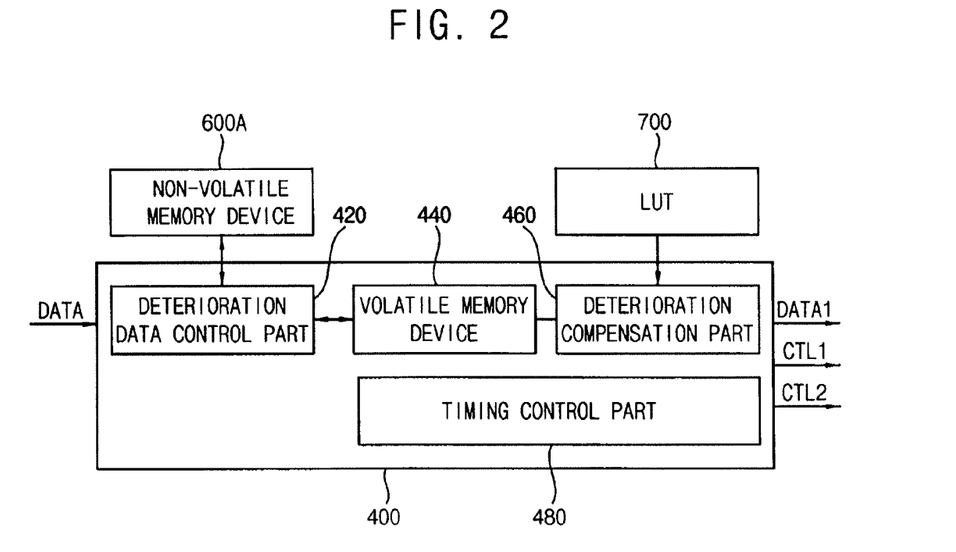
FIG. 2 illustrates an embodiment of a controller.

FIG. 2 illustrates an embodiment of a controller, which, for example, may correspond to controller 400 in the display device of FIG. 1. Referring to FIG. 2, the controller 400 includes a deterioration data control part 420, a volatile memory device 440, a deterioration compensation part 460, and a timing control part 480.

The deterioration data control part 420 may read the deterioration data from the non-volatile memory device 600A and load the deterioration data on the volatile memory device 440 when the display panel is initialized. When the display panel operates, it may be difficult to read the deterioration data from the non-volatile memory device 600A to compensate input image data DATA. This is because speed of the non-volatile memory device 600A may be slower than the speed of the volatile memory device 440. Therefore, the deterioration data control part 420 may read the deterioration data from the non-volatile memory device 600A and load the deterioration data on the volatile memory device 440, thereby compensating the input image data DATA using the deterioration data stored in the volatile memory device 440.

In addition, the deterioration data control part 420 may update the deterioration data stored in the volatile memory device 440. When the display panel operates, it may update the deterioration data, for example, in real time. Therefore, the deterioration data control part 420 may update the deterioration data stored in the volatile memory device 440 using the input image data DATA. For example, the deterioration data control part 420 may update the deterioration data stored in the volatile memory device 440 using an amount of driving data of each of the pixels in the input image data DATA. Therefore, the deterioration data control part 420 may operate as a memory controller for the non-volatile memory device 600A and the volatile memory device 440, thereby efficiently processing large-scale deterioration data of a high-resolution display device without additional memory controller.

The deterioration data control part 420 may read the deterioration data from the volatile memory device 440 and store the read deterioration data in the non-volatile memory device 600A. The speed of the volatile memory device 440 may be relatively faster than the speed of the non-volatile memory device 600A. However, the volatile memory device 440 may not maintain the deterioration data when power is not supplied. Therefore, to prevent loss of updated deterioration data, the deterioration data control part 420 may read the deterioration data from the volatile memory device 440 and store the read deterioration data in the non-volatile memory device 600A.

In one embodiment, the deterioration data control part 420 may periodically store the read deterioration data in the non-volatile memory device 600A. In another embodiment, the deterioration data control part 420 may store the read deterioration data in the non-volatile memory device 600A at a terminal operation of the display panel.

The deterioration data of the pixels may be stored in the volatile memory device 440, for example, while the display panel operates. The volatile memory device 440 may not maintain data when the power is not supplied. However, the volatile memory device 440 may relatively quickly read or write data. Therefore, the deterioration data may be stored in the volatile memory device 440 while the display panel operates. The input image data DATA may be compensated using the deterioration data stored in the volatile memory device 440. For example, the volatile memory device 440 may include a dynamic random access memory (DRAM), a static random access memory (SRAM), a mobile DRAM, etc.

The deterioration compensation part 460 may compensate the input image data DATA based on the deterioration data stored in the volatile memory device 440, thereby generating the output image data DATA1. In one embodiment, the deterioration compensation part 460 may derive cumulative driving data of the pixels from the deterioration data stored in the volatile memory device 440 and generate output image data DATA1 corresponding to the cumulative driving data using a look-up table (LUT) 700.

The timing control part 480 may provide control signals CTL1, CTL2, for displaying an image corresponding to the output image data DATA1, to a scan driver and a data driver, thereby controlling the scan driver and the data driver.

Figure 3:
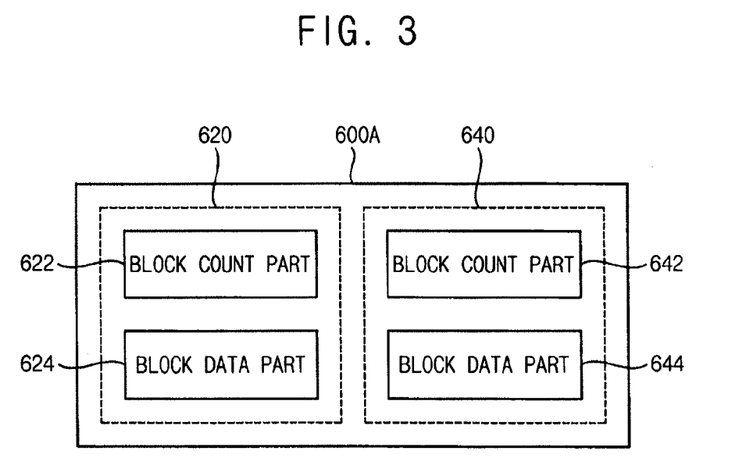
FIG. 3 illustrates an embodiment of a non-volatile memory device.

FIG. 3 illustrates an example of a non-volatile memory device, which, for example, may correspond to non-volatile memory device 600A in a display device of FIG. 1. Referring to FIG. 3, the non-volatile memory device 600A may include a plurality of memory sets. For example, the non-volatile memory device 600A may include a first memory set 620 and a second memory set 640. Each of the first memory set 620 and the second memory set 640 may include a block count part 622, 642 and a block data part 624, 644.

Block counts may be stored in the block count part 622, 542. Each block count may indicate a position in which corresponding block data is stored. Second validation data for verifying integrity of the block counts may be stored in the block count part 622, 642. Thus, each of a plurality of sets may include <the block count, the second validation data> stored in the block count part 622, 642.

The block data may be stored in the block data part 624, 644. The block data may be generated by dividing the deterioration data by a block unit and first validation data for verifying integrity of the block data. Thus, each of a plurality of sets may include <the block data, the first validation data> stored in the block data part 624, 644. The size of the block data may be determined, for example, corresponding to a reading or writing unit of the non-volatile memory device 600A. For example, if the non-volatile memory device 600A is a negative AND (NAND) flash memory device, the block data may have data of block unit indicating reading or writing unit of the non-volatile memory device 600A.

The same deterioration data may be redundantly stored in each of the first memory set 620 and the second memory set 640. In one embodiment, the first memory set 620 may perform a role as a master memory set and the second memory set 640 may perform a role as a slave memory set. The second memory set 640 may mirror the first memory set 620.

Integrity of the block data stored in each of the first memory set 620 and the second memory set 640 may be verified using the first validation data. Integrity of the block counts stored in each of the first memory set 620 and the second memory set 640 may be verified using the second validation data. In one embodiment, the first validation data and the second validation data may be generated by a parity checking technique, a checksum checking technique, or a cyclic redundancy check (CRC) technique.

Therefore, when the deterioration data are not normally stored in the non-volatile memory device 600A caused by an abnormal termination (such as unexpected power-off), deterioration data having an integrity verified by validation data stored in the first memory set 620 or the second memory set 640 may be used. Therefore, the non-volatile memory device 600A may stably store the deterioration data.

Figure 4:
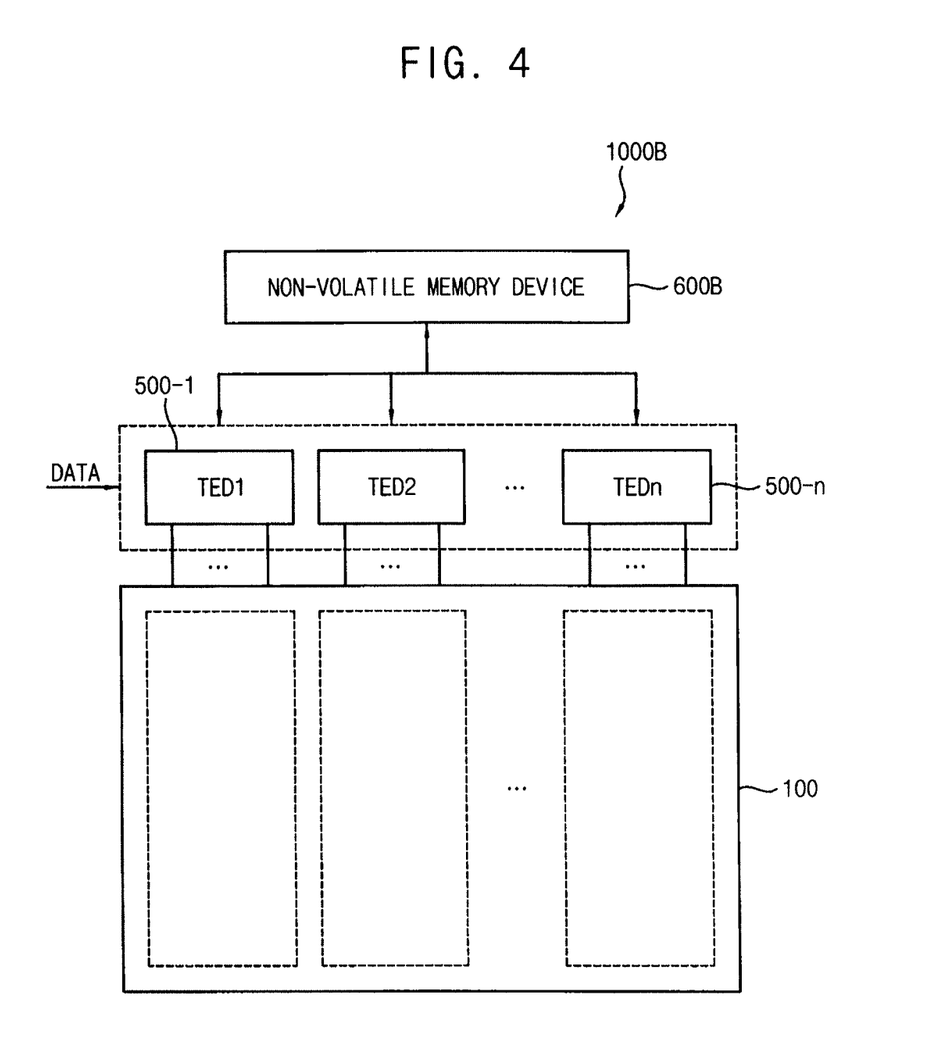
FIG. 4 illustrates another embodiment of a display device.

FIG. 4 illustrates another embodiment of a display device 1000B which includes a display panel 100, first through (N)th integration drivers 500-1 through 500n, and a non-volatile memory device 600B, where N is an integer greater than 1.

The display panel 100 includes a plurality of pixels for displaying image. The display panel 100 may be connected to the first through (N)th integration drivers 500-1 through 500n via a plurality of driving lines. Each of the first through (N)th integration drivers 500-1 through 500n may store deterioration data of the pixels in each of the memory sets in one of the first through (N)th memory groups. For example, a (K)th integration driver may store the deterioration data of the pixels corresponding to the (K)th integration driver in each of memory sets in the (K)th memory group, where K is an integer between 1 and N.

In one embodiment, the (K)th integration driver may store the deterioration data in each of the memory sets included in the (K)th memory group, and verify integrity of the deterioration data using validation data thereafter. For example, the (K)th integration driver may store validation data (e.g., parity value) for verifying the integrity of the deterioration data along with the deterioration data in the non-volatile memory device 600B.

Each of the first through (N)th integration drivers 500-1 through 500n may compensate input image data DATA based on the deterioration data to generate output image data. Thus, each of the first through (N)th integration drivers 500-1 through 500n may compensate input image data DATA using the deterioration data to reduce luminance difference between the pixels PX. In addition, each of the first through (N)th integration drivers 500-1 through 500n may provide output signals corresponding to the output image data to the pixels.

The non-volatile memory device 600B may include first through (N)th memory group. The first through (N)th integration drivers 500-1 through 500n may respectively store the deterioration data in the first through (N)th memory groups. Each of first through (N)th memory groups may include a plurality of memory sets. The non-volatile memory device 600B may be located outside of the controller 400.

In one embodiment, the (K)th memory group may include a master memory set and a slave memory set, where K is an integer between 1 and N. The (K)th integration driver of the first through (N)th integration drivers may sequentially store the deterioration data in each of the master memory set and the slave memory set in the (K)th memory group. Therefore, the (K)th integration driver may stably store the deterioration data in the (K)th memory group by mirroring the data.

In one embodiment, the deterioration data may be accumulatively stored in the non-volatile memory device 600B as time passed. The cumulatively stored deterioration data may be used for restoring damaged deterioration data or improving quality of the display panel 100.

Figure 5:
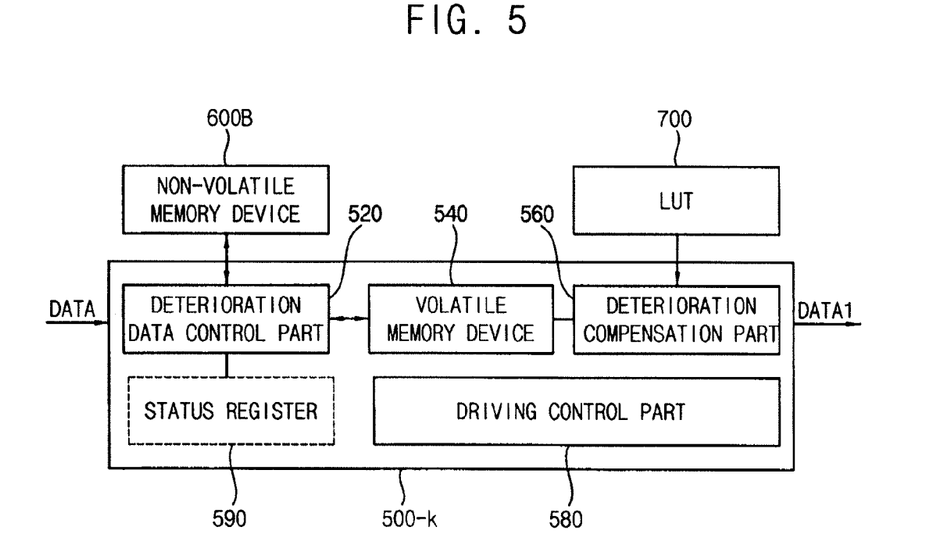
FIG. 5 illustrates an embodiment of an integration driver.

FIG. 5 illustrates an example of an integration driver, which, for example, may correspond to an integration driver in the display device of FIG. 4. Referring to FIG. 5, a (K)th integration driver 500-k may include a deterioration data control part 520, a volatile memory device 540, a deterioration compensation part 560, and a driving control part 580, where K is an integer between 1 and N.

The deterioration data control part 520, the volatile memory device 540, and the deterioration compensation part 560 in the (K)th integration driver 500-k according to the present embodiment may be substantially the same as a deterioration data control part, a volatile memory device, and a deterioration compensation part in a controller of the embodiment of FIG. 2.

In one embodiment, at least one selected from the first through (N)th integration drivers may include a status register 590 for checking whether the non-volatile memory device 600B operates, where N is an integer greater than 1. The first through (N)th integration drivers may store the deterioration data in the non-volatile memory device 600B using the status register 590 at different times. For example, the first integration driver may include the status register 590 to prevent simultaneous access to the non-volatile memory device 600B by the integration drivers. Thus, each of the integration drivers may perform a role as a memory controller of the non-volatile memory device 600B. The integration drivers may stably share the same non-volatile memory device 600B using the status register 590. In one embodiment, the status register 590 may store one flag for checking whether the non-volatile memory device 600B is operates or not. In another embodiment, the status register 590 may store a plurality of flags for checking whether each of the integration drivers is operates or not.

The deterioration data control part 520 may read the deterioration data from the non-volatile memory device 600B and load the deterioration data on the volatile memory device 540 when the display panel is initialized. The deterioration data control part 520 may update the deterioration data stored in the volatile memory device 540. The deterioration data control part 520 may read the deterioration data from the volatile memory device 540 and store the read deterioration data in the non-volatile memory device 600B, thereby preventing loss of the updated deterioration data. In one embodiment, the deterioration data control part 520 may periodically store the read deterioration data in the non-volatile memory device 600B.

The deterioration data of the pixels may store in the volatile memory device 540 while the display panel operates.

The deterioration compensation part 560 may compensate the input image data DATA based on the deterioration data stored in the volatile memory device 540, thereby generating the output image data DATA1.

The driving control part 580 may provide output signals corresponding to the output image data DATA1 to the pixels. For example, the driving control part 580 may perform a role as a timing controller and a data driver. The driving control part 580 may provide data signals to the pixels and provide control signals to a scan driver.

Figure 6:
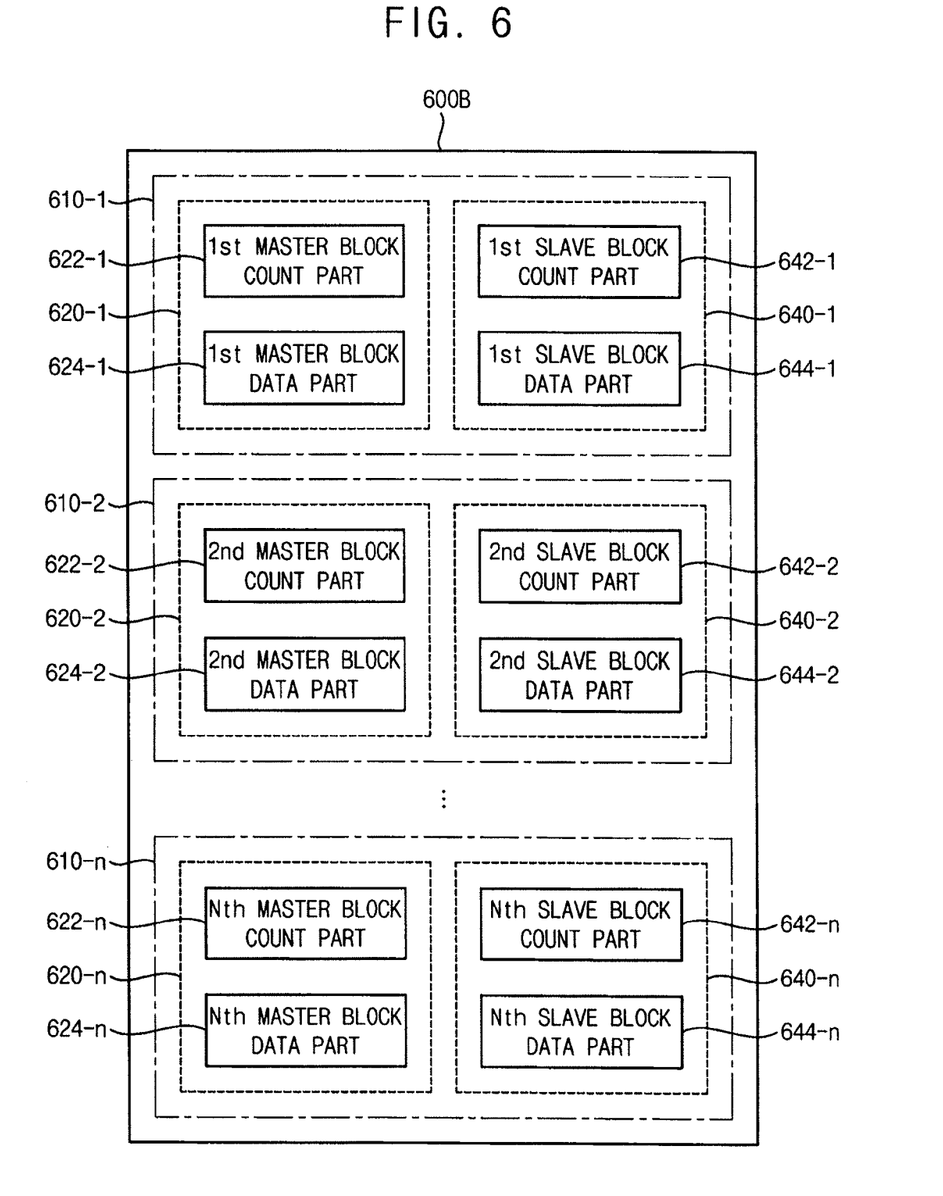
FIG. 6 illustrates another embodiment of a non-volatile memory device.

FIG. 6 illustrates an embodiment of a non-volatile memory device, which, for example, may be included in the display device of FIG. 4. Referring to FIG. 6, the non-volatile memory device 600B may include first through (N)th memory groups 610-1 through 610-n, where N is an integer greater than 1. Each of the first through (N)th memory groups may store the deterioration data using at least one selected from the first through (N)th memory groups 610-1 through 610-n. Each of the first through (N)th memory groups 610-1 through 610-n may include a plurality of memory sets. In one embodiment, the (K)th integration driver may redundantly store the deterioration data in the (K)th memory group including the (K)th master memory set and the (K)th slave memory set.

For example, the first master memory set 620-1 may include the first master block count part 622-1 and the first master block data part 624-1. The first slave memory set 640-1 may include the first slave block count part 642-1 and the first slave block data part 644-1.

Each of a plurality of block counts may indicate a position in which corresponding block data is stored, and second validation data for verifying the integrity of the block counts may be stored in the first master block count part 622-1 and the firsts slave block count part 642-1. Therefore, each of the plurality of sets may include <the block count, the second validation data> stored in the first master block count part 622-1 and the first slave block count part 642-1.

The block data may be generated by dividing the deterioration data by a block unit and first validation data for verifying integrity of the block data. This information may be stored in the first master block data part 624-1 and the first slave block data part 644-1. Therefore, each of a plurality of sets including <the block data, the first validation data> may be stored in the first master block data part 624-1 and the first slave block data part 644-1. The size of the block data may be determined, for example, corresponding to a reading or writing unit of the non-volatile memory device 600B. For example, if the non-volatile memory device 600B is a negative AND (NAND) flash memory device, the block data may have data of block unit indicating reading or writing unit of the non-volatile memory device 600B.

The same deterioration data may be redundantly stored in each of the first master memory set 620-1 and the first slave memory set 640-1. For example, the first slave memory set 640-1 may mirror the first master memory set 620-1.

Integrity of the block data stored in each of the first master memory set 620-1 and the first slave memory set 640-1 may be verified using the first validation data. Integrity of the block counts stored in each of the first master memory set 620-1 and the first slave memory set 640-1 may be verified using the second validation data. In one embodiment, the first validation data and the second validation data may be generated by a parity checking technique, a checksum checking technique, or a cyclic redundancy check (CRC) technique.

Therefore, when the deterioration data are not normally stored in the non-volatile memory device 600B caused by an abnormal termination (e.g., unexpected power-off), deterioration data of which integrity is verified by validation data stored in the first master memory set 620-1 or the first slave memory set 640-1 may be used. Therefore, the non-volatile memory device 600B may stably store the deterioration data. In addition, a plurality of integration drivers may store the deterioration data in the same non-volatile memory device 600B, thereby reducing manufacturing cost of the display device.

Although the example embodiments of FIG. 6 describe that the (K)th memory group includes the (K)th master memory set and the (K)th slave memory set, the (K)th memory group may include more than two memory sets in another embodiment.

Figure 7:
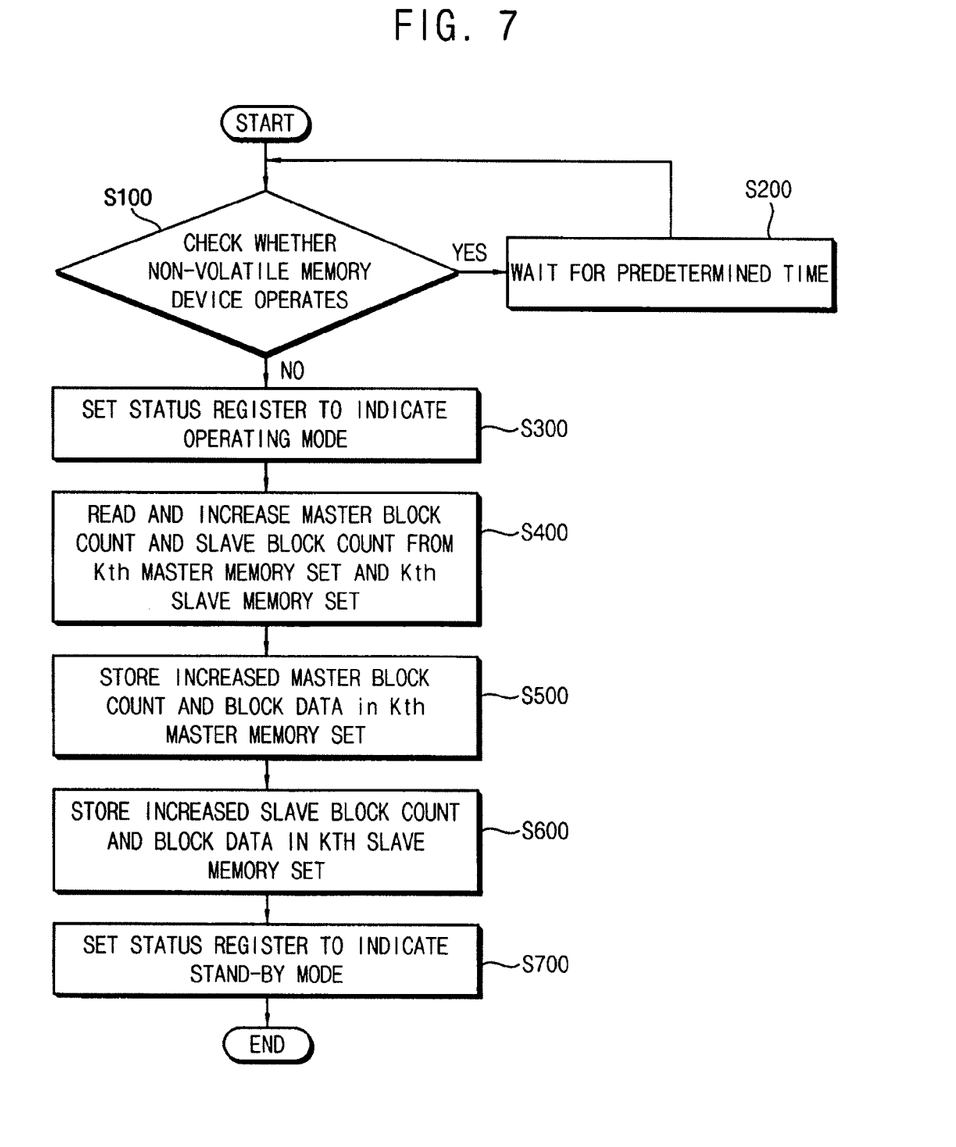
FIG. 7 illustrates an embodiment of a method for driving a display device.

FIG. 7 illustrates operations included in an embodiment of a method for driving a display device, which, for example, may be any of the aforementioned embodiments of the display device.

Referring to FIG. 7, whether the non-volatile memory device operates may be checked by monitoring a status register (Step S100). In one embodiment, the status register may store one flag for checking whether the non-volatile memory device is operates or not. In another embodiment, the status register may store a plurality of flags for checking whether each of the integration drivers is operates or not.

When the non-volatile memory device operates, waiting for the predetermined time (operation S200). The operation status of the non-volatile memory device may be repeatedly checked until the non-volatile memory device does not operate (e.g., stand-by status). Thus, when the non-volatile memory device is used by another integration driver, the integration driver may wait for a while to prevent simultaneous access to the non-volatile memory device.

When the non-volatile memory device does not operate, the status register may be set to indicate an operating mode (operation S300). The integration driver may set the status register to indicate the operating mode for preventing simultaneous access to the non-volatile memory device by the other integration drivers, thereby preventing data collisions.

The (K)th integration driver, where K is an integer between 1 and N, may read a master block count from a master memory set included in a (K)th memory group and a slave block count from at least one selected from slave memory sets included in the (K)th memory group. The (K)th integration driver may increase the master block count and the slave block count (operation S400).

The (K)th integration driver may store the increased master block count and the block data in the master memory set included in the (K)th memory group (operation S500). The (K)th integration driver may store the increased master block count and the block data that are generated by dividing the deterioration data by a block unit in the master memory set to compensate deterioration of the pixels.

The (K)th integration driver may store the increased slave block count and the block data in the slave memory set included in the (K)th memory group (operation S600). The (K)th integration driver may store the increased slave block count and the block data in the slave memory set to prepare for data loss caused by an abnormal termination such as unexpected power-off.

The status register may be set to indicate a stand-by mode (operation S700) such that any integration drivers may access and use the non-volatile memory device.

Therefore, a method for driving the display device stores deterioration data in the one non-volatile memory device at a plurality of integration drivers, thereby stably storing the deterioration data and reducing manufacturing cost of the display device.

Figure 8:
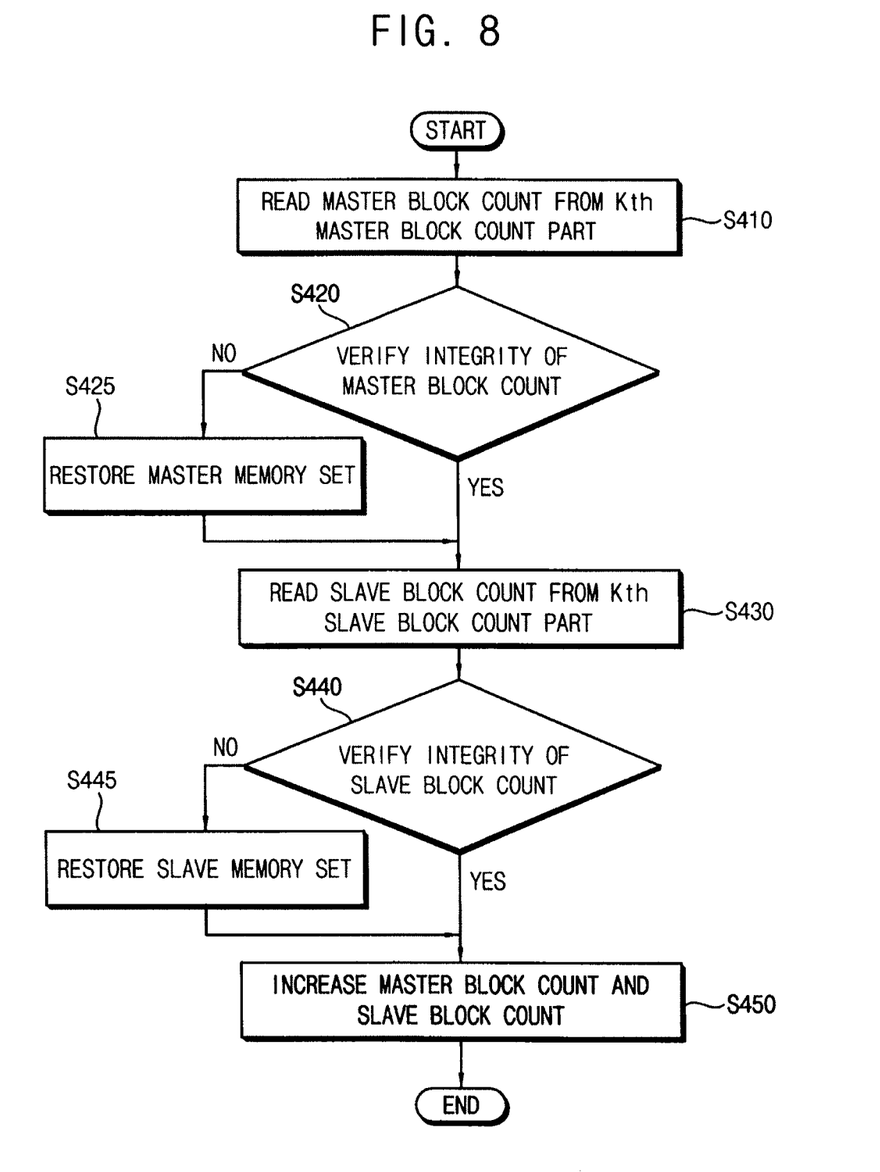
FIG. 8 illustrates an example of reading and increasing block counts.

FIG. 8 illustrates an example of reading and increasing block counts in the method of FIG. 7. Referring to FIG. 8, a master block count may be read from a master memory set and a slave block count may be read from at least one selected from slave memory sets.

The (K)th integration driver may read the master block count from a master block count part included in the master memory set of the (K)th memory group (operation S410). The (K)th integration driver may verify integrity of the master block count (operation S420). When integrity of the master block count is damaged, the (K)th integration driver may restore the master block count and the block data (operation S425). For example, the (K)th integration driver may restore the master block count and the block data by loading previous master block count and previous master block data from the master memory set.

The (K)th integration driver may read the slave block count from a slave block count part included in the slave memory set of the (K)th memory group (operation S430). The (K)th integration driver may verify integrity of the slave block count (operation S440). When integrity of the slave block count is damaged, the (K)th integration driver may restore the slave block count and the block data (operation S445). For example, the (K)th integration driver may restore the master block count and the block data by loading previous slave block count and previous slave block data from the slave memory set.

When integrity of the block counts is verified, the (K)th integration driver may increase the master block count and the slave block count to store the block data (operation S450).

Figure 9:
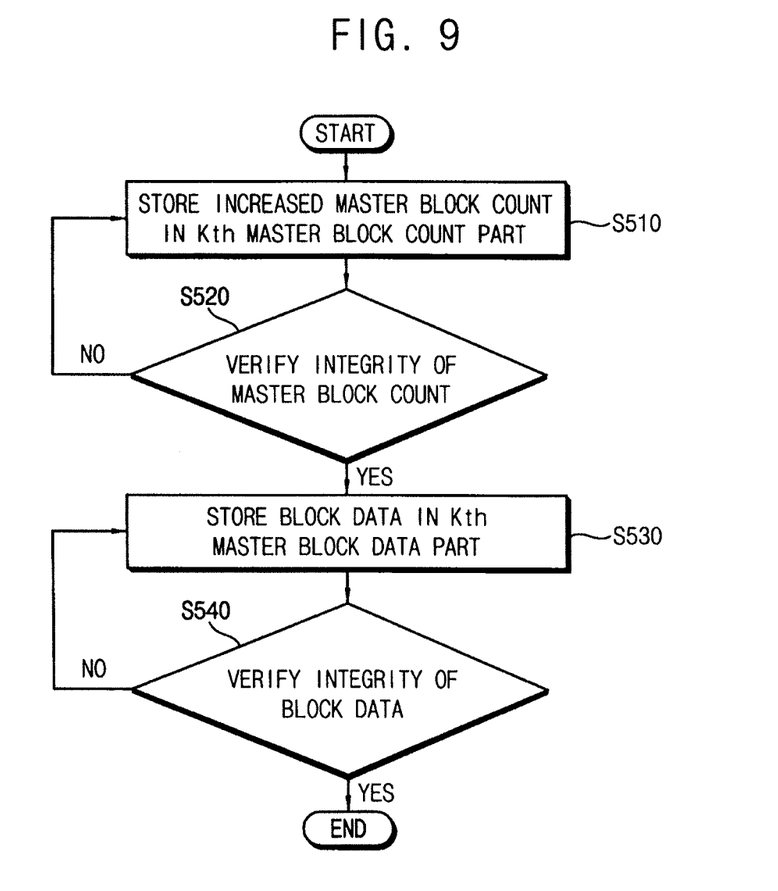
FIG. 9 illustrates an example of storing deterioration data in a master memory.

FIG. 9 illustrates an example of storing deterioration data in a master memory set in the method of FIG. 7. Referring to FIG. 9, the increased master block count and block data may be stored in the master memory set.

The (K)th integration driver may store the increased master block count in a master block count part included in the master memory set of the (K)th memory group (operation S510). The (K)th integration driver may store validation data (e.g., parity value) for verifying integrity of the master block count along with the master block count.

The (K)th integration driver may verify integrity of the master block count stored in the master block count part (operation S520). When integrity of the master block count is damaged, the (K)th integration driver may store the master block count in the master block count part again.

The (K)th integration driver may store the block data in a master block data part included in the master memory set of the (K)th memory group (operation S530). The (K)th integration driver may store validation data (e.g., parity value) for verifying integrity of the block data along with the block data along with the block data.

The (K)th integration driver may verify integrity of the block data stored in the master block data part (operation S540). When integrity of the block data is damaged, the (K)th integration driver may store the block data in the master block data part again.

Therefore, the (K)th integration driver may store the increased master block count and the block data in the master memory set and verify the integrity of the stored master block count and the stored block data, thereby stably storing the deterioration data.

Figure 10:
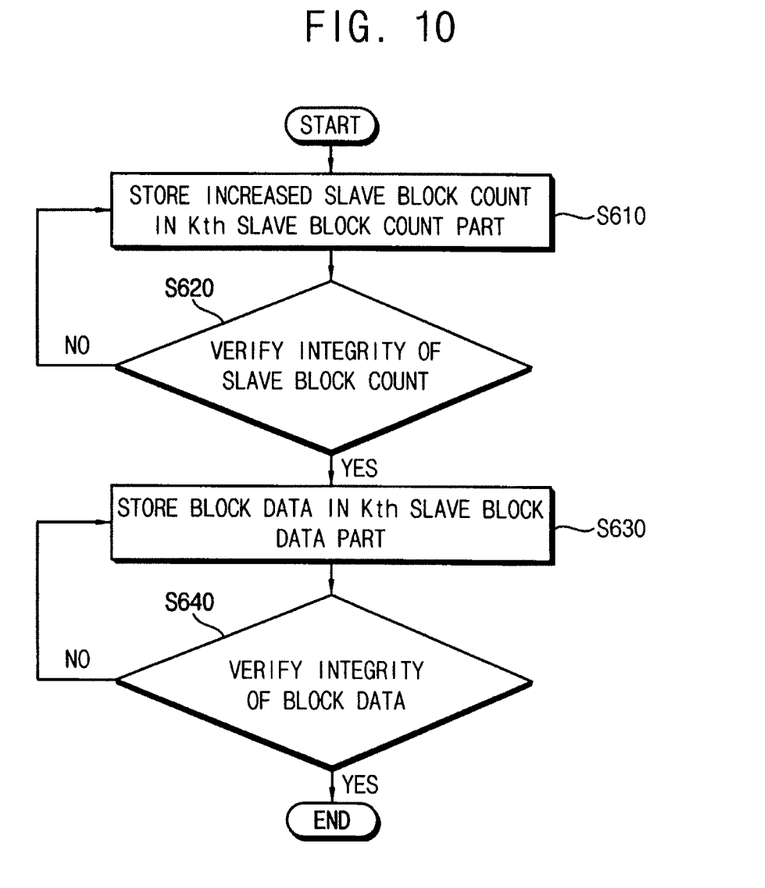
FIG. 10 illustrates an example of storing deterioration data in a slave memory.

FIG. 10 illustrates an example of storing deterioration data in a slave memory set in the method of FIG. 7. Referring to FIG. 10, the increased slave block count and block data may be stored in the slave memory set.

The (K)th integration driver may store the increased slave block count in a slave block count part included in the slave memory set of the (K)th memory group (operation S610). The (K)th integration driver may store validation data (e.g., parity value) for verifying integrity of the slave block count along with the slave block count.

The (K)th integration driver may verify integrity of the slave block count stored in the slave block count part (operation S620). When integrity of the slave block count is damaged, the (K)th integration driver may store the slave block count in the slave block count part again.

The (K)th integration driver may store the block data in a slave block data part included in the slave memory set of the (K)th memory group (operation S630). The (K)th integration driver may store validation data (e.g., parity value) for verifying integrity of the block data along with the block data.

The (K)th integration driver may verify integrity of the block data stored in the slave block data part (operation S640). When integrity of the block data is damaged, the (K)th integration driver may store the block data in the slave block data part again.

Therefore, the (K)th integration driver may store the increased slave block count and the block data in the slave memory set and verify the integrity of the stored slave block count and the stored block data, thereby stably storing the deterioration data.

Although the example embodiments describe that the display device is an organic light emitting display device, the display device another type of display devices. Also, the aforementioned embodiments may be applied to an electronic device having the display device. Examples include a cellular phone, a smart phone, a smart pad, a personal digital assistant (PDA), etc.

By way of summation and review, a high-resolution display device may use a high-capacity memory device to store deterioration data of pixels. In this device, the method of compensating deterioration data may be used. However, this method may have some problems, such as increasing the manufacturing cost of the display device and loss of deterioration data by abnormal termination.

In accordance with one or more of the aforementioned embodiments, A display device may redundantly store deterioration data of pixels in a non-volatile memory device and verifies integrity of block data and block counts. The display device may therefore stably store the deterioration data as time passes. In addition, a plurality of integration drivers may store the deterioration data in one non-volatile memory device, thereby stably storing the deterioration data and reducing manufacturing cost of the display device.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the present invention as set forth in the following claims.

What is claimed is:

1. A method of driving a display device, that includes first through (N)th integration drivers each periodically storing deterioration data of pixels in a non-volatile memory device that includes first through (N)th memory groups and each compensating image data based on the deterioration data, where N is an integer greater than 1, the method comprising:

checking whether the non-volatile memory device operates by monitoring a status register;

setting the status register to indicate an operating mode when the non-volatile memory device does not operate;

reading and increasing, at a (K)th integration driver, a master block count from a master memory set included in a (K)th memory group and a slave block count from at least one of slave memory sets in the (K)th memory group, the master block count and the slave block count, each indicating a position in which each of block data is stored, the block data generated by dividing the deterioration data by a block unit, where K is an integer between 1 and N;

storing, at the (K)th integration driver, the increased master block count and the block data in the master memory set included in the (K)th memory group;

storing, at the (K)th integration driver, the increased slave block count and the block data in the slave memory set included in the (K)th memory group; and setting the status register to indicate a stand-by mode, wherein reading and increasing the master block count and the slave block count includes:

reading the master block count from a master block count area in the master memory set of the (K)th memory group;

verifying integrity of the master block count;

reading the slave block count from a slave block count area in the slave memory set of the (K)th memory group;

verifying integrity of the slave block count; and increasing the master block count and the slave block count.

2. The method as claimed in claim 1, wherein storing the increased master block count and the block data in the master memory set includes:

storing the increased master block count in a master block count area included in the master memory set of the (K)th memory group;

verifying integrity of the master block count stored in the master block count area;

storing the block data in a master block data area in the master memory set of the (K)th memory group; and verifying integrity of the block data stored in the master block data area.

3. The method as claimed in claim 1, wherein storing the increased slave block count and the block data in the slave memory set includes:

storing the increased slave block count in a slave block count area in the slave memory set of the (K)th memory group;

verifying integrity of the slave block count stored in the slave block count area;

storing the block data in a slave block data area in the slave memory set of the (K)th memory group; and verifying integrity of the block data stored in the slave block data area.

* * * * *